United States Patent [19]

Tigelaar

[11] Patent Number: 5,273,926
[45] Date of Patent: Dec. 28, 1993

[54] METHOD OF MAKING FLASH EEPROM OR MERGED FAMOS CELL WITHOUT ALIGNMENT SENSITIVITY

[75] Inventor: Howard L. Tigelaar, Allen, Tex.
[73] Assignee: Texas Instruments Incorporated, Dallas, Tex.
[21] Appl. No.: 850,209
[22] Filed: Mar. 12, 1992

Related U.S. Application Data

[63] Continuation of Ser. No. 722,640, Jun. 27, 1991, abandoned.

[51] Int. Cl.⁵ .................................. H01L 21/70
[52] U.S. Cl. .................................. 437/52; 437/43; 437/48
[58] Field of Search .............. 437/43, 48, 52, 228, 437/233, 235; 357/23.5

[56] References Cited

U.S. PATENT DOCUMENTS

| | | |
|---|---|---|
| 4,180,826 | 12/1979 | Shappir . |
| 4,203,158 | 5/1980 | Frohman-Bentch. . |
| 4,258,456 | 3/1981 | Kuo et al. ............... 437/43 |
| 4,258,466 | 3/1981 | Kuo et al. . |
| 4,281,397 | 7/1981 | Neal et al. . |
| 4,288,256 | 9/1981 | Ning et al. . |
| 4,373,248 | 2/1983 | McElroy . |
| 4,377,818 | 3/1983 | Kuo et al. ............... 357/23 |
| 4,377,857 | 3/1983 | Tickle ................... 365/185 |
| 4,451,904 | 5/1984 | Sugiura et al. .......... 365/182 |
| 4,493,057 | 1/1985 | McElroy . |
| 4,545,034 | 10/1985 | Chatterjee et al. . |
| 4,569,117 | 2/1986 | Baglee et al. . |
| 4,590,504 | 5/1986 | Guterman . |
| 4,597,060 | 6/1986 | Mitchell . |
| 4,622,737 | 11/1986 | Ravaglia . |
| 4,652,897 | 3/1987 | Okuyama et al. . |

(List continued on next page.)

FOREIGN PATENT DOCUMENTS

| | | |
|---|---|---|
| 0105802 | 4/1984 | European Pat. Off. . |
| 0144900 | 6/1985 | European Pat. Off. . |
| 8501146 | 3/1985 | PCT Int'l Appl. . |

OTHER PUBLICATIONS

Sahir Parpia et al., "Modeling and Characterization of CMOS-Compatible High-Voltage Device Structures", *IEEE*, 1987, pp. 2335-2343.

Dumitru Cioaca et al., "A Million-Cycle CMOS 256K EEPROM", *IEEE*, 1987, pp. 684-691.

K. Y. Chang et al., "An Advance High Voltage CMOS Process for Custom Logic Circuits with Embedded EEPROM", *IEEE*, 1988 Custom Integrated Circuits Conference, 25.5.1-25.5.5.

Roger Cuppens et al., "An EEPROM for Microprocessors and Custom Logic", *IEEE*, 1984 International Solid-State Circuits Conference, pp. 268-269.

Jun-ichi Miyamoto et al., "High Performance Single Polysilicon EEPROM Cells", Semiconductor Device Engineering Lab., Toshiba Corp., Kawasaki, Japan (believed to have been presented at the ISSCC in Feb., 1985).

S. M. Sze, *Physics of Semiconductor Devices*, Wiley-Interscience Publication, pp. 496-506, 2d Ed. 1981.

*Primary Examiner*—Tom Thomas
*Attorney, Agent, or Firm*—Ira S. Matsil; James C. Kesterson; Richard L. Donaldson

[57] ABSTRACT

An electrically-erasable and programmable read-only memory cell includes a gate insulator layer formed on the face of a semiconductor layer having a first conductivity type. A conductive floating gate is formed on the gate insulator layer and has first and second portions with a gap substantially laterally separating the first and second portions. An interlevel insulator layer is formed on exposed faces of the floating gate. A conductive control gate is formed on the interlevel insulator layer in the gap and to be capacitively coupled to the floating gate. A source region and a drain region of a second conductivity type are formed beside opposite exterior lateral margins of the floating gate. The EEPROM cell of the invention avoids channel length alignment problems found in prior art EEPROM cells.

18 Claims, 4 Drawing Sheets

U.S. PATENT DOCUMENTS

| | | |
|---|---|---|
| 4,668,970 | 5/1987 | Yatsuda et al. . |
| 4,669,177 | 6/1987 | D'Arrigo et al. . |
| 4,672,409 | 6/1987 | Takei et al. . |
| 4,686,558 | 8/1987 | Adam ................................ 357/235 |
| 4,695,979 | 9/1987 | Tuvell et al. . |
| 4,698,787 | 10/1987 | Mukherjee et al. . |
| 4,715,014 | 12/1987 | Tuvell et al. . |
| 4,718,041 | 1/1988 | Baglee et al. . |
| 4,733,482 | 3/1988 | West et al. . |
| 4,736,342 | 4/1988 | Imondi et al. . |
| 4,742,492 | 5/1988 | Smayling et al. . |
| 4,750,024 | 6/1988 | Schreck . |
| 4,766,473 | 8/1988 | Kuo . |
| 4,768,080 | 8/1988 | Sato . |
| 4,794,433 | 12/1988 | Kamiya et al. . |
| 4,797,372 | 1/1989 | Verret et al. . |
| 4,804,637 | 2/1989 | Smayling et al. . |
| 4,822,750 | 4/1989 | Perlegos et al. .................. 437/43 |
| 4,829,351 | 5/1989 | Engles et al. . |
| 4,853,895 | 8/1989 | Mitchell et al. . |
| 4,855,800 | 8/1989 | Esquivel et al. ................. 457/23.5 |
| 4,861,730 | 8/1989 | Hsia et al. ........................ 357/23.5 |
| 4,872,041 | 10/1989 | Sugiura et al. . |
| 4,878,096 | 10/1989 | Shirai et al. . |
| 4,879,254 | 11/1989 | Tsuzuki et al. . |
| 4,887,142 | 12/1989 | Bertotti et al. . |
| 4,892,840 | 1/1990 | Esquivel et al. ................. 357/23.5 |
| 4,912,676 | 3/1990 | Paterson et al. . |
| 4,924,437 | 5/1990 | Paterson et al. .................. 437/43 |
| 4,935,791 | 6/1990 | Namaki et al. . |
| 4,939,558 | 7/1990 | Smayling et al. ................ 357/23.5 |
| 4,947,222 | 8/1990 | Gill et al. . |
| 4,980,309 | 12/1990 | Mitchell et al. ................... 437/43 |
| 5,028,553 | 7/1991 | Esquivel et al. .................. 437/43 |
| 5,100,819 | 3/1992 | Gill et al. .......................... 437/43 |

METHOD OF MAKING FLASH EEPROM OR MERGED FAMOS CELL WITHOUT ALIGNMENT SENSITIVITY

This application is a continuation of application Ser. No. 07/722,640, filed Jun. 27, 1991, now abandoned.

FIELD OF THE INVENTION

The present invention relates to electronic semiconductor devices, and, more particularly, to electrically-erasable and programmable memory devices or merged FAMOS devices and methods of fabrication without alignment sensitivity.

BACKGROUND OF THE INVENTION

Non-volatile semiconductor memory devices based on metal-oxide-semiconductor field effect transistors (MOSFETS) were first proposed in 1967 (see Sze, "Physics of Semiconductor Devices" (*Wiley-Interscience*, pages 496–506, 2d Ed. 1981). These devices store a bit of information as the presence or absence of a quantity of electrical charge on a floating gate that is located so that the charge affects the threshold voltage of a MOSFET. Currently/ MOSFET non-volatile memory devices include EPROMS, EEPROMS and Flash EEPROMS.

Flash EEPROMS are hybrids that program in the manner of either EPROMS (avalanche-injection) or EEPROMS (tunneling) and erase in the manner of EEPROMS (tunneling) but with the erasure generally limited to bulk electrical erasure of the entire memory analogous to the ultraviolet light erasure of an EPROM. Flash EEPROMS have the advantage of smaller cell size in comparison with standard EEPROMS because the cells are not erased individually. Instead, the array of cells is erased in bulk.

Flash EEPROMS, which use the merged pass gate structure to turn off the channel if the floating gate has been overerased, are very sensitive to alignment. If the floating gate and control gate of one of these flash EEPROM cells are misaligned, the length of the channel controlled by the control gate will increase or decrease, and the remainder of the channel length (controlled by the floating gate) will correspondingly decrease or increase, thereby causing variations in the reading, writing and programming characteristics of the cell. It has therefore become desirable to devise an EEPROM or merged FAMOS device which can be fabricated without alignment sensitivity.

SUMMARY OF THE INVENTION

According to the invention, an electrically-erasable, electrically-programmable read-only memory cell is formed at a face of a layer of semiconductor of a first conductivity type. A gate insulator layer is formed on the face of the semiconductor layer. A conductive floating gate having first and second portions is formed on the surface of the gate insulator layer. The first and second portions of the conductive floating gate are separated by a gap. A source region and a drain region, each of a second conductivity type opposite the first conductivity type, are formed at the face of the semiconductor layer to be spaced by a channel area and adjacent the exterior lateral surfaces of the first and second portions of the floating gate, respectively.

An insulating layer is the formed adjacent the top surface and at least the interior lateral surfaces of the first and second portions of the floating gate.

A layer of oxide is formed on the exposed surfaces of the first and second portions of the floating gate, the channel area inside the gap, and over the source region and drain region. A conductive control gate is then formed on top of this insulating oxide which covers the floating gate and the channel region in the gap between the first and second portions of the floating gate.

The technical advantages of the present invention include a structure and method of fabrication which substantially eliminates or reduces disadvantages and problems associated with prior EEPROM memory cells. One important aspect is the lack of alignment sensitivity which provides better quality memory cells with better programmability and less variation than cells presently existing in the art.

BRIEF DESCRIPTION OF THE DRAWINGS

Other aspects of the invention and their advantages will be discerned when one refers to the following detailed description as taken in conjunction with the drawings, in which:

FIGS. 3a-1, 3a-2, 3b, 3c and 3e are greatly enlarged schematic elevational sectional views of a semiconductor layer showing progressive stages in the fabrication of an EEPROM cell according to the invention;

FIG. 5a is a plan view of a section of a memory cell array workpiece, FIG. 3e being taken substantially along line 3a-1 - 3a-1 of FIG. 5a, FIG. 3a-2 being taken substantially along line 3a-2 - 3a-2 of FIG. 5a;

DETAILED DESCRIPTION OF THE INVENTION

The preferred embodiment of the present invention is best understood by referring to FIGS. 1 through 5 of the drawings, like numerals being used for like and corresponding parts of the various drawings.

Figure 1:
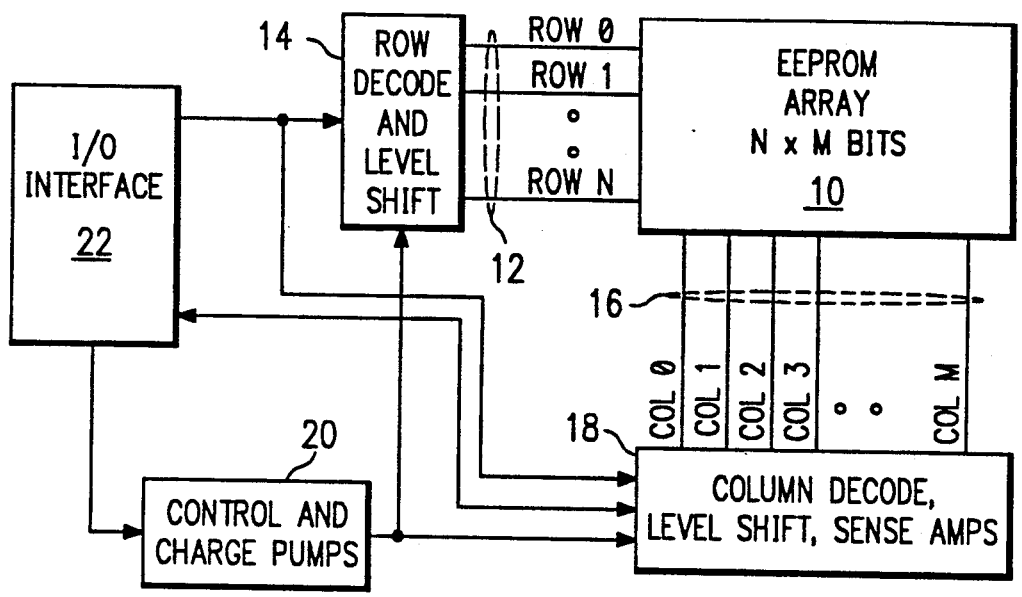
FIG. 1 is a schematic functional block diagram of an EEPROM memory matrix.

FIG. 1 is a schematic functional block diagram of an architecture of an EEPROM memory matrix 10. It should be understood that the EEPROM array 10 may stand alone as an independent integrated circuit and incorporate the memory cells described herein, as well as being a module on a larger integrated circuit. The array proper 10 may have, for example, N rows and M columns, for an array of N×M bits. An array of suitable size may have 8K words with 8 bits per word, for a total of 64K bits. These may be organized in an array of, for example, 256 rows by 256 columns, or 128 rows by 512 columns.

EEPROM array 10 has a plurality of row lines 12 which are connected to a row decoder 14, and a plurality of column lines 16 which are connected to a column decoder, level shifter and sense amplifier section 18. The row decoder block 14 and the column decoder block 18 are in turn connected to a control and charge pump circuit block 20. The control and charge pump block 20 and the row decoder block 14 are connected to an input/output interface block 22 which is interposed between the decoder 14 and the charge pump block 20 and the external connections of the chip or module on which the EEPROM array 10 is placed. Input/output interface block 22 is also connected to the column decoder block 18.

Figure 2:
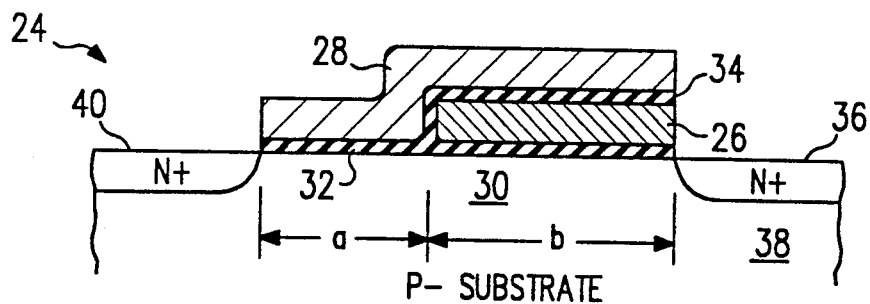
FIG. 2 is a greatly enlarged schematic elevational sectional view of a semiconductor layer showing a memory cell according to the prior art.

FIG. 2 is highly magnified schematic elevational sectional view of an EEPROM memory cell according to the prior art. The cell, indicated generally as 24, has in conventional practice been used to form the array 10 as shown in FIG. 1. The conventional EEPROM cell 24 includes a floating gate 26 and a control gate 28. The floating gate 26 and the control gate 28 are insulatively spaced from a channel 30 by thin gate oxides 32a and 32b which for example may be 400 Å and 100 Å thick respectively. If the EEPROM cell 24 is of the Fowler Nordheim programming type, the gate oxide 32 may be thinner adjacent the source region 36 to allow Fowler Nordheim tunneling (not shown). The floating gate 26 and the control gate 28 are insulatively separated from each other by an insulating layer 34, which, for example, may be an oxide/nitride composite layer to give improved dielectric performance.

The channel 30 is adjacent to a source region 36, here shown as (n+) where the substrate or epitaxial layer 38 on which the cell 24 is formed is (p) type. The channel 30 spaces the source 36 from an (n+) drain 40.

The conventional cell 24 has had alignment problems because the length a of that portion of the channel 30 having its conductance controlled by the control gate 28 and the length b of that portion of the channel 30 having its conductance controlled by the floating gate 26, may vary according to alignment. If the floating gate 26 is misaligned, the length b may become shorter or longer than planned, causing a reciprocal variation in the length a. This in turn will cause fluctuations from cell to cell and the chip in the amount of read current, as well as variations in programming and erasing voltages. The present invention is a solution to this prior art misalignment problem.

Figures 1, 3A:
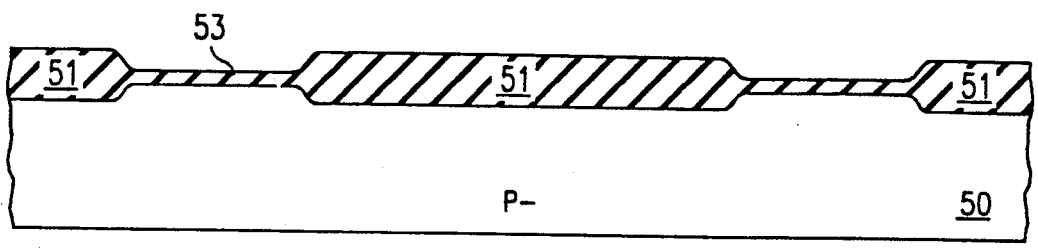
Figures 2, 3A:
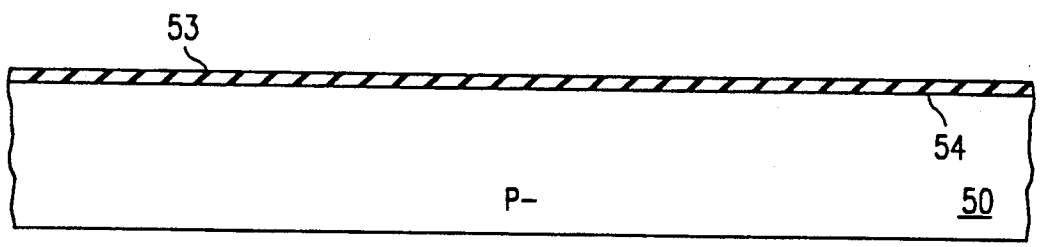
Figure 5A:
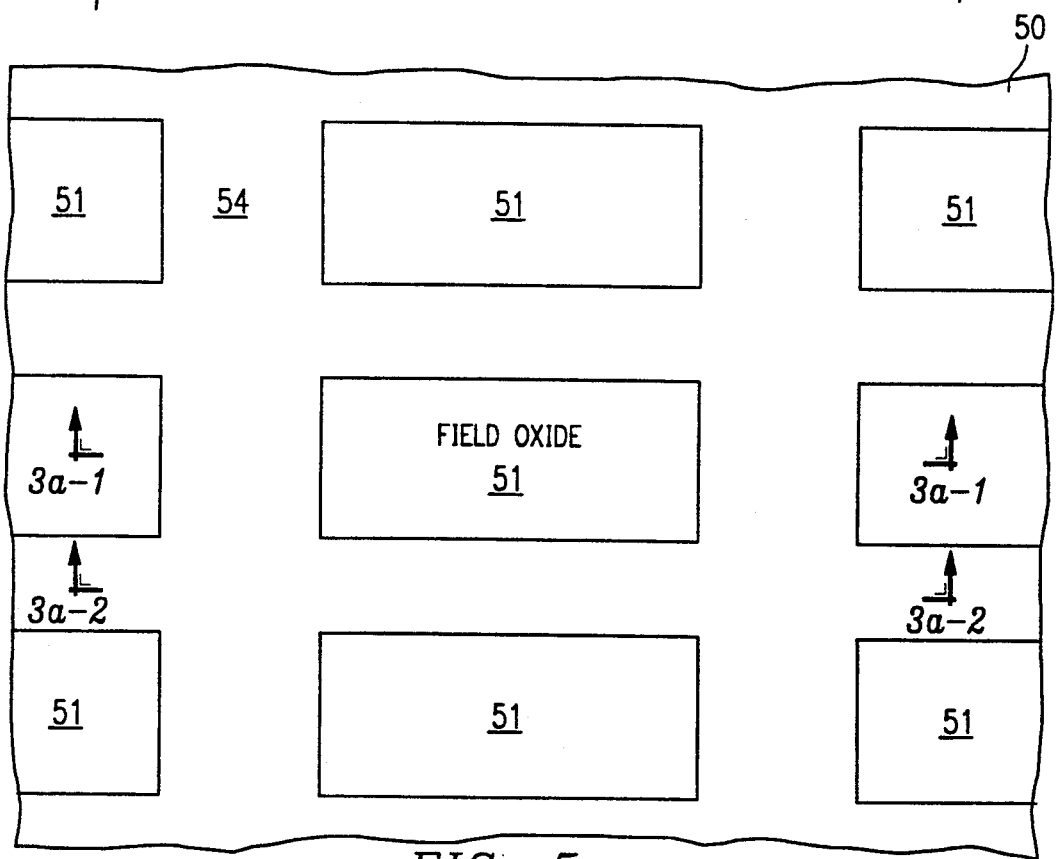
Figure 5B:
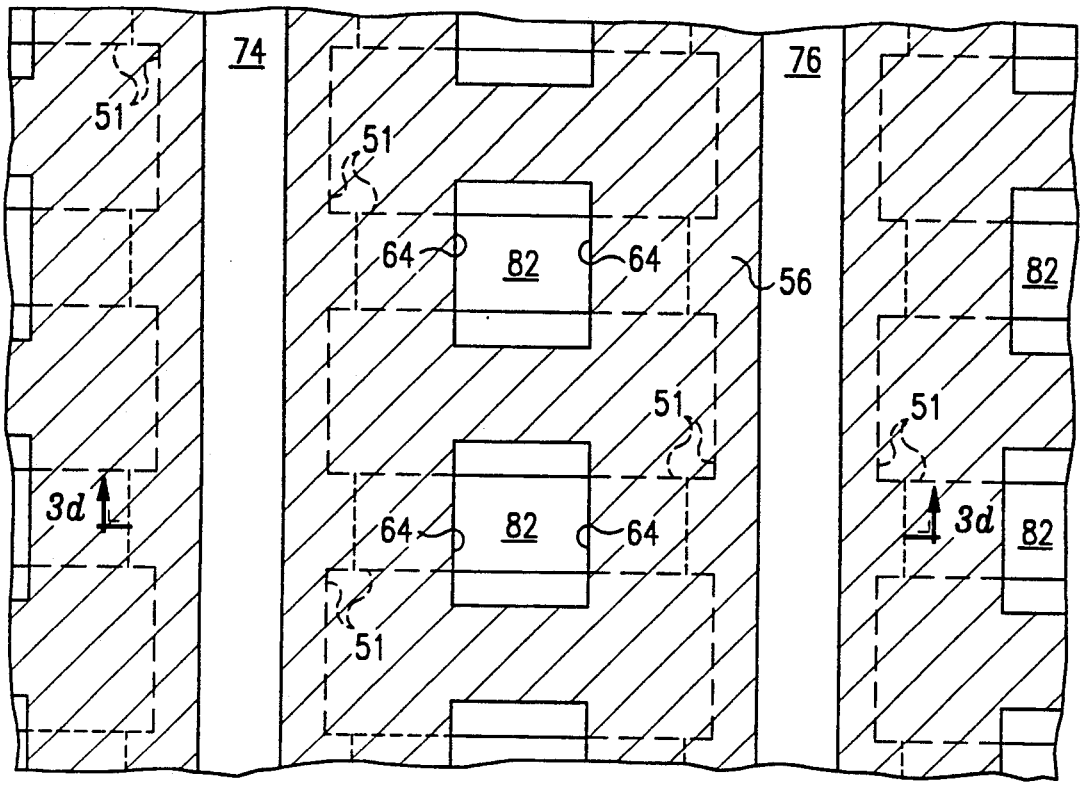
FIG. 5b is a plan view of a section of the memory cell array workpiece shown in FIG. 5a, FIG. 3d being taken substantially along line 3d—3d of FIG. 5b.

Attention is now directed to FIG. 5a which shows a plan view of a semiconductor substrate 50, and FIGS. 3a-1 and 3a-2 which are sectional views taken substantially along sections 3a-1 - 3a-1 and 3a-2 - 3a-2, respectively. FIG. 3a-1 is a cross-sectional view taken through a future channel region of a cell, and FIG. 3a-2 is taken through a transistor isolation region. A semiconductor substrate or layer 50 is provided and is preferably doped (p-). A thick (approximately 4000Å) isolation oxide 51 is grown in selected regions on the surface 54 of the substrate 50 in the usual manner. A pad oxide 53 is thereafter grown on exposed areas of the semiconductor surface 54.

Figure 3B:
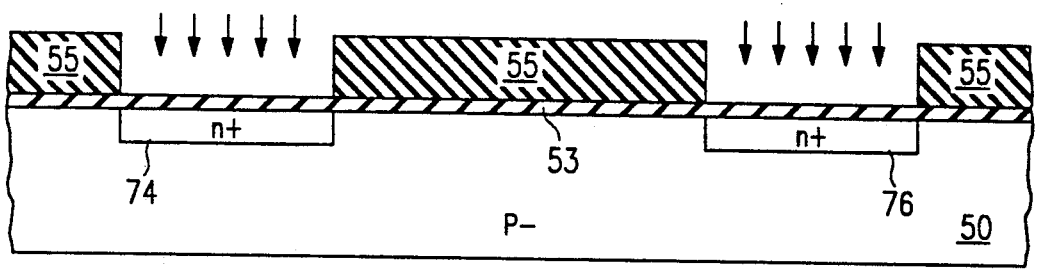
Figure 3C:
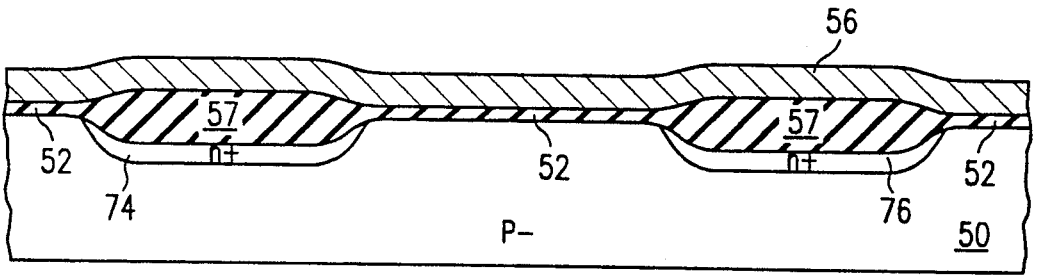

A resist pattern 55 is then used as shown in FIG. 3b to form elongated strips of heavily doped N+ regions that run the length of the array and form the source and drain bit lines. (FIGS. 3b-3c are taken along the same section as that shown in FIG. 3a-2). A two stage implant may be conducted: first, an implantation of phosphorus at a dose of $4\times 10^{14}$ cm$^{-2}$, followed by implantation of arsenic at a dose of $5\times 10^{15}$ cm$^{-2}$. These implantations may be followed by an anneal under nitrogen at 900° C. to create graded junctions. Pad oxide 53 may next be stripped.

Turning next to FIG. 3c, an oxidation step is then performed, forming a thick oxide 57 on the order of 2000 Å over the highly doped n+ regions 74 and 76. A thin oxide 52 on the order of 150 Å is next formed over the lightly doped channel region. This is followed by the deposition of a highly-doped polycrystalline silicon (poly) layer 56 which may be deposited to a depth of approximately 2000 Å. Poly layer 56 may be doped in situ with phosphorus to render it highly conductive.

Figure 3D:
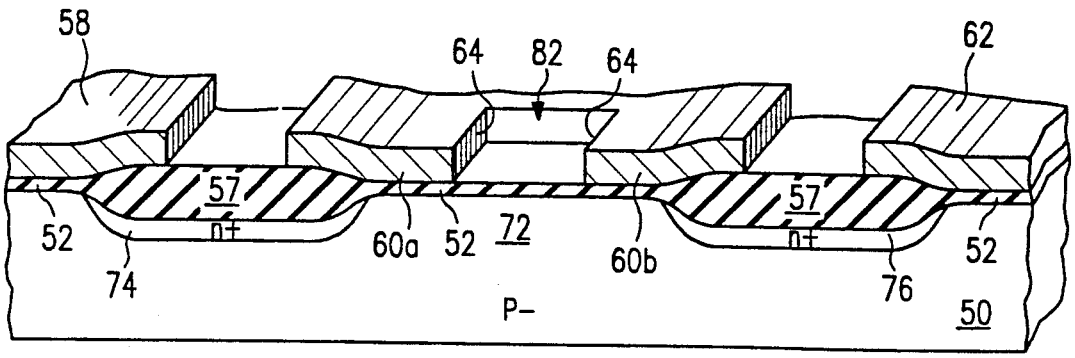
FIG. 3d is a partially sectional, partially isometric view corresponding to the section shown in FIGS. 3a–3c and 3e and showing a stage in the fabrication of the cell.

Referring to FIG. 3d, which is a part-sectional, part-isometric view corresponding to FIG. 3c, a layer (not shown) of photoresist is used to pattern the first poly layer 56 into long strips that are separated by a slot running the length of the array over the thick N+ oxide. In addition, a rectangular opening 82 is formed above the middle of the channel 72 and extending onto the isolation oxide as shown in the plan view of FIG. 5b. In the sectional view shown in FIG. 3d, this appears as two elements 60a and 60b. Each of the floating gate elements 60a and 60b should preferably extend over the channel region 72 on the order of 0.6 μm. One half of an adjacent floating gate 58 is also shown as well as one half of an adjacent floating gate 62. It should be assumed by the reader that the remaining floating gates of the array 10 are fabricated simultaneously with the small number actually shown in FIG. 3d.

The distance between the interior lateral faces 64 of the floating gate elements 60a and 60b should preferably be on the order of 0.8 microns.

An implant can be performed at this point into the gap region to adjust the threshold voltage of the control gate transistor that will be formed in this region.

Figure 3E:
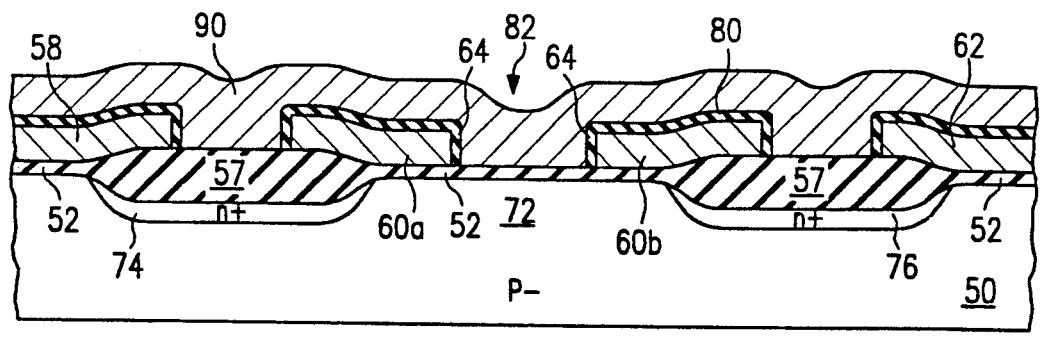

Referring next to FIG. 3e, thermal oxide is now grown on the exposed surfaces of the floating gate poly 56 to form an insulation layer 80 between the floating gates 58, 60 and 62, and the control gate 90, and is also grown on the exposed channel region in the gap 82 to the gate oxide 84 of the control gate transistor. This oxide may be 300 to 400 Å. If a thinner insulating dielectric between the floating gate and the control gate is desired, a thin oxide/nitride stack (typically 150 Å oxide plus 250 Å nitride) may be deposited prior to patterning and etching the floating gate. The nitride will block any further increase in dielectric thickness during oxidation.

Figure 5C:
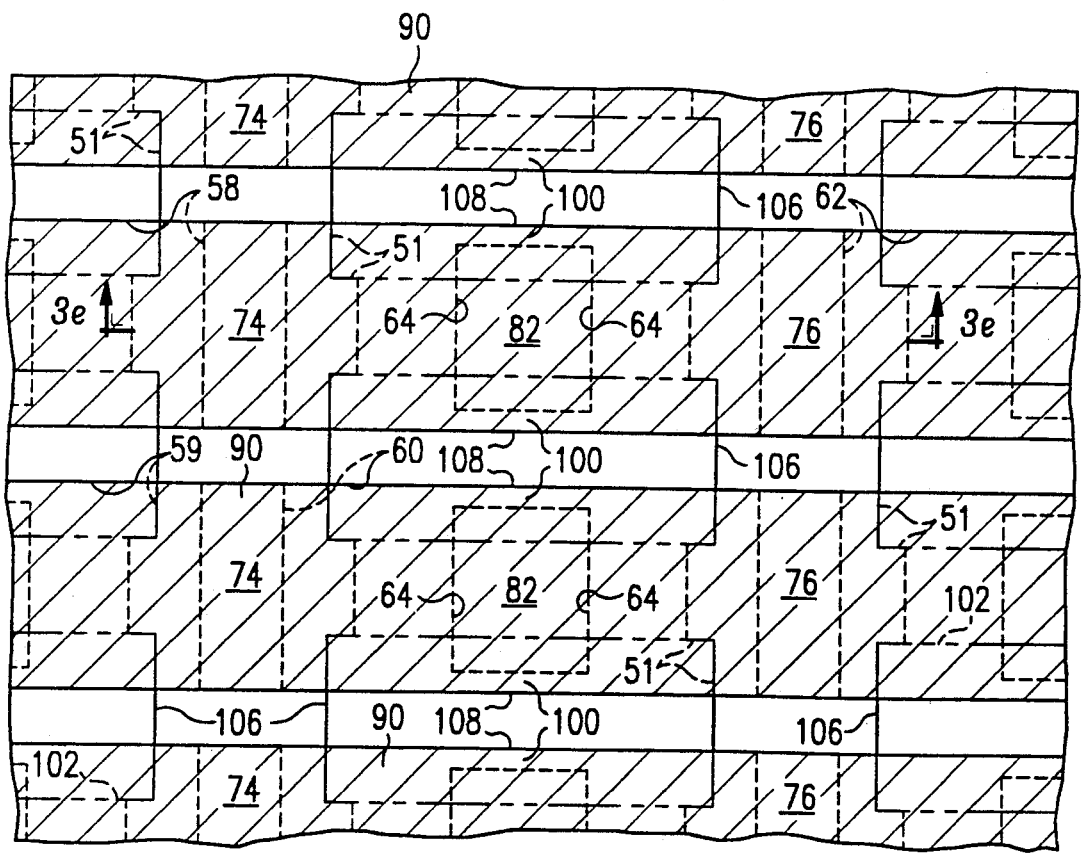
FIG. 5c is a plan view of a section of a memory cell array corresponding to FIGS. 5a and 5b, FIG. 3e being taken substantially along line 3e—3e of FIG. 5c.

A second highly-doped polycrystalline silicon layer 90 is deposited over the insulating layers 80 and 84, and within gaps or orifices 82 as shown to form the control gate. Poly layer 90 should preferably be deposited to a thickness of 3000 Å. The poly is then patterned and etched perpendicular to the source and drain bit lines to form the wordlines 90 as shown in FIG. 5c. Subsequent layers such as a deposited and densified borophosphosilicate (BPSG) layer, and metal contacts made through this BPSG layer, are conventional and have been omitted for the purpose of brevity.

Figure 4:
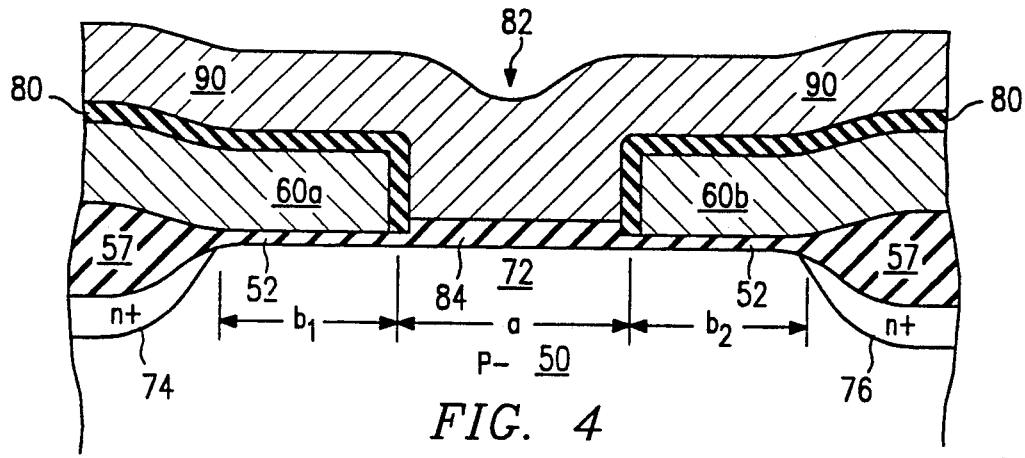
FIG. 4 is an enlarged detail of FIG. 3e.

FIG. 4 is a somewhat enlarged detail of FIG. 3e to illustrate a principal advantage of the invention. The EEPROM cell of the invention has its channel 72 divided into three regions: a first region controlled by floating gate portion 60a and having a length $b_1$, a middle region controlled by the control gate 90 and having a length a, and a third region controlled by floating gate 60b and having a length $b_2$. If there is a misalignment in one or another direction, a gate length, e.g., $b_2$, would decrease, but this would cause the gate length $b_1$ to increase. The length a of the central region would stay approximately the same, as would the total floating gate channel length $b_1+b_2$. Hence, the operational characteristics of the EEPROM cell remain approximately the same from cell to cell.

FIG. 5c is a highly enlarged schematic plan view of a portion of the EEPROM array 10, where FIG. 3e has been taken substantially along section 3e—3e as shown. The floating gates 58-62 are shown in phantom, and preferably take the form of hollowed-out rectangles. Portions 100 above and below the channel 72 which may extend over the field oxide 51, connect the floating gate portions 60a and 60b to be a single conductive unit. The horizontal margins 102 (as they appear in FIG. 5e) of channel 72 are delimited by the thick (such as 4000 Å) field oxide islands 51. The vertical or side margins 106 of the field oxide islands 51 are coterminous with respective margins of source region 74 and drain region 76. Preferably, a (p) type channel stop implant (not shown) is implanted into the areas subsequently occupied by the oxide islands 51 in order to further electrically isolate the channels 72 one from another.

The control gates 90 are disposed at 90° to the elongate implanted source and drain regions 74 and 76, and have top and bottom horizontal margins 108 collinear with the top and bottom margins of the floating gates 58-62. The top and bottom margins of the floating gates 58-62 and the control gates 90 may extend onto the adjacent field oxide islands 51 in order to enhance capacitive coupling. Control gates 90 as shown in FIG. 5e correspond to the column lines 16 shown in FIG. 1, while the source and drain regions 74 and 76 correspond to the row lines 12.

The cell of the invention is read, written to and erased in a fashion similar to conventional EEPROM cells such as the cell shown in FIG. 2.

While the preferred embodiment of the invention and their advantages have been set forth in the above detailed description, the invention is not limited thereto but only by the scope and spirit of the appended claims.

What is claimed is:

1. A process for fabricating an electrically-erasable and programmable read only memory cell at a face of semiconductor layer having a first conductivity type, comprising the steps of:
   implanting a dopant of a second conductivity type opposite that of the first conductivity type to create source and drain regions at the face of the semiconductor layer;
   forming a gate insulator layer at the face;
   forming a floating gate layer on the gate insulator layer;
   etching the floating gate layer to form a floating gate having exterior lateral margins and an orifice therein;
   insulating the floating gate layer with an interlevel insulator layer; and
   forming a conductive control gate layer in the orifice to be adjacent the gate insulator layer and over the floating gate insulator layer.

2. The process of claim 1, and further comprising, prior to said step of implanting, forming a thick insulator layer such that said thick insulator layer will be under said exterior lateral margins of said floating gate; and forming said conductive control gate layer adjacent said thick insulator layer.

3. The process of claim 1, wherein said cell is one of a plurality of cells formed at said face of said semiconductor layer in rows and in columns, the process further comprising the step of forming a plurality of said control gate layers to be spaced apart in a column direction, a control gate layer provided for each column of said cells.

4. The process of claim 1, wherein said gate insulator comprises a layer of 400 Å thick oxide.

5. The process of claim 1, wherein said floating gate layer comprises doped polycrystalline silicon.

6. The process of claim 1, wherein said interlevel insulator layer comprises an oxide/nitride stack.

7. The process of claim 1, wherein said conductive control gate layer comprises doped polycrystalline silicon.

8. The process of claim 1, wherein said source and drain regions are elongate and formed in parallel in said semiconductor layer.

9. The process of claim 1, and further comprising, after said step of implanting, growing relatively thick oxide regions over said source and regions, such that said relatively thick oxide regions will be disposed underneath said control gate layer.

10. The method of claim 1 wherein a channel region is defined in the face of said semiconductor layer between said source and drain regions such that the fraction of said channel region beneath said floating gate is substantially independent of misalignment during said etching step.

11. The method of claim 1 wherein a channel region is defined in the face of said semiconductor layer between said source and drain regions such that:
   a first portion of said channel region is controlled in part by a first portion of said floating gate, said first portion of said floating gate formed adjacent one side of said orifice;
   a second portion of said channel region is controlled by said control gate, said second portion having a selected length; and
   a third portion of said channel region is controlled in part by a second portion of said floating gate, said second portion of said floating gate formed adjacent another side of said orifice opposite said one side;
   wherein said selected length of said second portion of said channel region is substantially independent of misalignment during said etching step.

12. A process for fabricating a non-volatile memory cell, comprising the steps of:
   doping source and drain regions separated by a channel region in a semiconductor layer;
   forming a gate insulator layer over said channel region;
   forming a floating gate layer over said gate insulator layer;
   etching said floating gate layer to form a floating gate such that said floating gate includes exterior lateral margins and an orifice therein;
   forming an interlevel insulator layer said floating gate; and
   forming a conductive control gate layer over said interlevel insulator layer.

13. The method of claim 12 and further comprising prior to said doping step, forming a thick insulator layer such that said thick insulator layer will be under said exterior lateral margins of said floating gate and such that said control gate layer extends over said thick insulator layer.

14. The method of claim 12 wherein said cell is one of a plurality of cells formed in said semiconductor layer in rows and columns, said process further comprising forming a plurality of control gate layers to be spaced apart in a column direction, a control gate layer provided for each column of said cells.

15. The process of claim 12 wherein said doping step comprises an implantation step.

16. The process of claim 12 wherein said source and drain regions are doped with n-type impurities.

17. The process of claim 16 wherein said channel region is doped with p-type impurities.

18. The process of claim 12 wherein said floating gate layer and said control gate layer comprises doped polycrystalline silicon.

* * * * *